(12) United States Patent
Leobandung

(10) Patent No.: US 10,522,686 B2
(45) Date of Patent: Dec. 31, 2019

(54) VERTICAL THIN FILM TRANSISTOR

(71) Applicant: INTERNATIONAL BUSINESS MACHINES CORPORATION, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 15/715,526

(22) Filed: Sep. 26, 2017

(65) Prior Publication Data
US 2019/0097064 A1  Mar. 28, 2019

(51) Int. Cl.
*H01L 29/66* (2006.01)
*H01L 29/78* (2006.01)
*H01L 29/772* (2006.01)
*H01L 29/786* (2006.01)
*H01L 23/52* (2006.01)

(52) U.S. Cl.
CPC ........ *H01L 29/78642* (2013.01); *H01L 23/52* (2013.01); *H01L 29/786* (2013.01)

(58) Field of Classification Search
CPC ......... H01L 29/78642; H01L 29/78696; H01L 29/78672; H01L 29/78663; H01L 27/108; H01L 27/0629; H01L 27/10876; H01L 27/10885; H01L 27/10823; H01L 27/10814; H01L 27/10808; H01L 27/10847; H01L 27/10852; H01L 29/1037; H01L 29/0676; H01L 29/42392; H01L 29/66666; H01L 29/66787; H01L 29/7827; H01L 29/78639; H01L 2924/10271; H01L 2924/13087; H01L 2924/1436; H01L 29/78651; H01L 29/7889; H01L 29/7926; H01L 29/6656; H01L 27/10805; H01L 27/1085; H01L 27/10855; H01L 27/10873; H01L 29/0673; H01L 29/0878;
(Continued)

(56) References Cited

U.S. PATENT DOCUMENTS 5,504,359 A * 4/1996 Rodder ............... H01L 29/1033
257/302
5,637,898 A 6/1997 Baliga
(Continued)

FOREIGN PATENT DOCUMENTS

CN 1638147 A 7/2005
CN 106910773 A 6/2017

OTHER PUBLICATIONS

Wu, H. et al., "RRAM Cross-Point Arrays" 3D Flash Memories (Jun. 2016) Springer Netherlands, pp. 223-260.
(Continued)

*Primary Examiner* — Natalia A Gondarenko
(74) *Attorney, Agent, or Firm* — Tutunjian & Bitetto, P.C.; Vazken Alexanian

(57) ABSTRACT

A semiconductor device includes a stack of layers stacked vertically and including a source layer, a drain layer and a channel layer between the source layer and the drain layer. A gate electrode is formed in a common plane with the channel layer and a gate dielectric is formed vertically between the gate electrode and the channel layer. A first contact contacts the stack of layers on a first side of the stack of layers, and a second contact formed on an opposite side vertically from the first contact.

20 Claims, 10 Drawing Sheets

(58) Field of Classification Search
CPC ........... H01L 29/4238; H01L 29/42364; H01L 29/42356; H01L 29/1054; H01L 29/10; H01L 29/16; H01L 29/161; H01L 29/20; H01L 29/49; H01L 29/66; H01L 29/66439; H01L 29/66484; H01L 29/66522; H01L 29/66545; H01L 29/66977; H01L 29/66636; H01L 29/6659; H01L 29/66795; H01L 29/66825; H01L 29/66477; H01L 29/78618; H01L 29/78; H01L 29/7834; H01L 29/7842; H01L 29/7883; H01L 29/775; H01L 29/785; H01L 21/02532; H01L 21/2652; H01L 21/823412; H01L 21/22; H01L 21/225; H01L 21/2256; H01L 21/2253; H01L 21/28176; H01L 21/2818; H01L 21/84; H01L 21/32133; H01L 21/31105; H01L 21/311; H01L 21/3213; H01L 21/823807; H01L 21/8234; H01L 21/8238; H01L 21/823821; H01L 21/823814
USPC ............. 257/57, 9, 296, 297, 300, 306, 308, 257/327–329; 438/269, 212

See application file for complete search history.

(56) References Cited

U.S. PATENT DOCUMENTS

| | | | |
|---|---|---|---|
| 6,150,687 A | 11/2000 | Noble et al. | |
| 6,424,001 B1 | 7/2002 | Forbes et al. | |
| 7,723,756 B2 | 5/2010 | Thomas | |
| 8,115,243 B2* | 2/2012 | Forbes | H01L 27/10876 257/261 |
| 8,951,893 B2 | 2/2015 | Ellis-Monaghan et al. | |
| 9,076,523 B2 | 7/2015 | Lee et al. | |
| 9,343,545 B2 | 5/2016 | Lam et al. | |
| 9,450,023 B1* | 9/2016 | Konevecki | H01L 27/2454 |
| 2004/0043550 A1* | 3/2004 | Chakihara | H01L 21/823885 438/199 |
| 2005/0164454 A1* | 7/2005 | Leslie | H01L 27/10876 438/269 |
| 2008/0212382 A1* | 9/2008 | Mouttet | H03K 19/177 365/189.15 |
| 2008/0277663 A1 | 11/2008 | Kang et al. | |
| 2011/0227023 A1 | 9/2011 | Bethune et al. | |
| 2014/0061572 A1* | 3/2014 | Cho | H01L 21/8239 257/4 |
| 2014/0252454 A1* | 9/2014 | Rabkin | H01L 27/249 257/329 |
| 2015/0069320 A1* | 3/2015 | Rabkin | H01L 21/02403 257/5 |
| 2015/0255619 A1* | 9/2015 | Shimabukuro | H01L 29/78642 257/314 |
| 2018/0204931 A1* | 7/2018 | Reboh | H01L 29/42392 |

OTHER PUBLICATIONS

International Search Report Issued in PCT/IB2018/057247 dated Dec. 9, 2018, 8 pages.

* cited by examiner

VERTICAL THIN FILM TRANSISTOR

BACKGROUND

Technical Field

The present invention generally relates to field effect transistors (FETs), and more particularly to vertically disposed FETs with high resistance read out for cognitive device circuits.

Description of the Related Art

Cognitive device circuits can include neural networks or other machine learning device structures. Typical transistor operation prefers higher current to reduce signal delay. However, higher current transistor devices may not be suitable for many cognitive device circuits, which may need lower current specifications for proper operation.

SUMMARY

In accordance with an embodiment of the present invention, a semiconductor device includes a stack of layers stacked vertically and including a source layer, a drain layer and a channel layer between the source layer and the drain layer. A gate electrode is formed in a common plane with the channel layer and a gate dielectric is formed vertically between the gate electrode and the channel layer. A first contact contacts the stack of layers on a first side of the stack of layers, and a second contact is formed on an opposite side vertically from the first contact.

Another semiconductor device includes a substrate having front end of the line (FEOL) devices formed thereon and a cross bar grid including first lines and second lines formed transversely to the first lines. Back end of the line (BEOL) vertical transistors are formed over an interlevel dielectric layer, the vertical transistors each including a stack of layers stacked vertically and including a source layer, a drain layer and a channel layer between the source layer and the drain layer; a gate electrode formed in a common plane with the channel layer; a gate dielectric formed vertically between the gate electrode and the channel layer; a first contact connecting the source layer to a first line of the first lines; and a second contact formed on an opposite side vertically from the first contact and connecting the drain layer to a second line of the second lines.

A method for forming a semiconductor device includes forming a first contact through an interlevel dielectric layer (ILD); forming a stack of layers on the ILD layer over the first contact, the stack of layers including a source layer, a drain layer and a channel layer between the source layer and the drain layer; forming a spacer layer over the ILD layer; conformally depositing a gate dielectric over the spacer layer and the stack of layers; forming a gate electrode in a common plane with the channel layer over the gate dielectric on the spacer layer; and forming a second contact on an opposite side vertically from the first contact.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
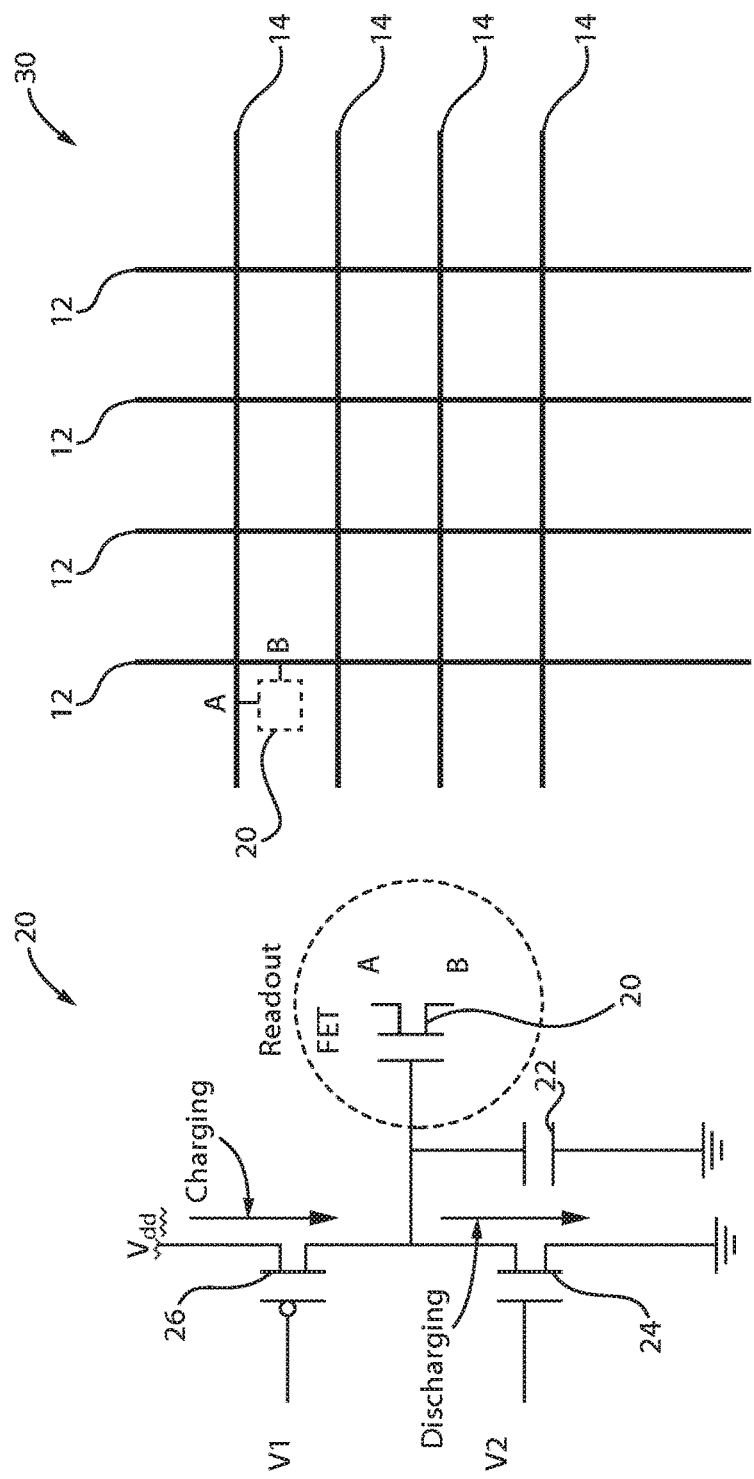
FIG. 1 is a schematic diagram showing a charge/discharge circuit along with a crossbar grid for a employing a low mobility and high resistance reset transistor in accordance with an embodiment of the present invention.

Aspects of the present invention are directed to high resistance field effect transistors (FETs). The high resistance FETs can be employed for read out operations for memory devices and are particularly useful in cognitive devices, which can include neural networks and the like. The high resistance FETs can include low mobility properties that result in lower current. These properties can be provided by materials and doping levels in the source, drain and channel layers of the TFT device.

In useful embodiments, the high resistance FETs can be included in crossbar circuits where the high resistance FETs are part of a circuit connecting metal lines in rows and columns of a crossbar grid. In other embodiments, the TFT device can be employed in display applications or the like. While typical transistor operation prefers higher current due to low delay performance, some applications, such as, cross bar cognitive applications, need lower current or higher resistance to provide satisfactory operation.

Embodiments of the present invention include a new vertical thin film transistor (TFT) device that can include low mobility and hence low current. The TFT can be fabricated at a substrate surface as a front end of the line device (FEOL) or as a back end of the line (BEOL) device or combinations or variations thereof. The TFT built at the BEOL can be provided closer to wiring and a BEOL capacitor, which are often fabricated later in the fabrication process. Such placement can have advantages in reducing delay and other electronic benefits as well as efficient use of available chip area. The TFT is preferably vertically disposed to provide ease of manufacture as well as chip area efficiency.

In useful embodiments, methods for forming vertical TFTs in accordance with aspects of the present invention are provided. While the vertical TFT can be formed at or near a substrate level (e.g., FEOL), the methods will describe details for formation of the vertical TFT at the BEOL for a semiconductor device or chip.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a schematic diagram shows a circuit 10 having a readout field effect transistor (FET) 20. The readout FET 20 is employed between nodes A and B to read out charge stored in a capacitor 22. The capacitor 22 is charged or discharged in accordance with inputs $V_1$ and $V_2$, which control the charging and discharging of the capacitor 22 using a charge transistor 26 and a discharge transistor 24. The charge transistor 26 and discharge transistor 24 can include a p-type FET (PFET) and an N-type FET (NFET respectively; however, these devices and the readout transistor 20 (e.g., an NFET) can have reversed polarities as needed.

It should be understood that the circuit 10 can include additional or different components and may perform similar or completely different tasks (e.g., a pixel transistor for a display device, etc.), as needed. In one useful embodiment, the readout FET 20 is included in a crossbar array 30. The crossbar array 30 includes a grid of transverse metal lines 12, 14. One set (e.g., lines 12) of the metal lines can include bitlines; while the other set, e.g., lines 14, can include wordlines, or vice versa. Sources and drains (nodes A and B) of the readout FET 20 are coupled to the lines 12, 14.

In one embodiment, the crossbar array 30 forms a neural network or other cognitive device that simulates neurons. A neural network stores path information that simulates learning in devices. The properties of the readout FET 20 can be altered to provide responsiveness that simulates learning. In one embodiment, high resistance or low current can be employed to serve the objective of the array 30 as a cognitive device. Other uses and methods can also be employed.

Figure 2:
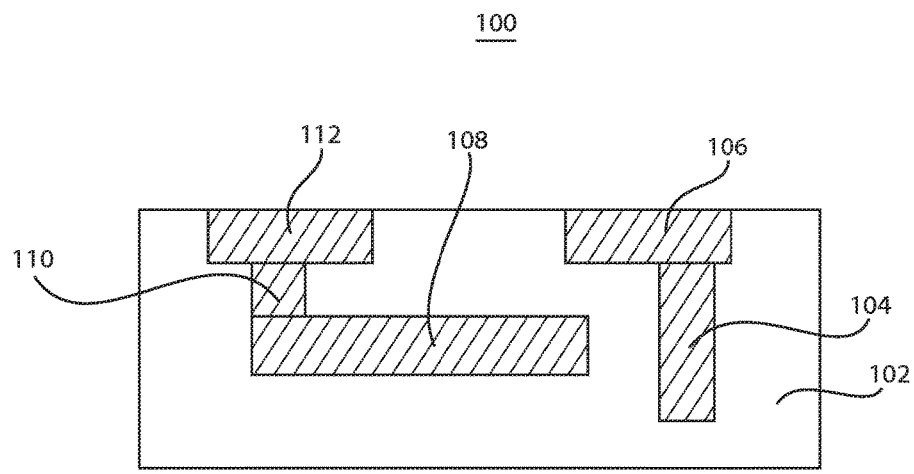
FIG. 2 is a cross-sectional view showing a back end of the line (BEOL) region having metal structures for forming connections to a thin film transistor to be formed in accordance with an embodiment of the present invention.

Referring to FIG. 2, a cross-sectional view of a semiconductor device 100 is shown in a partially fabricated state. In this example, the device 100 has undergone previous processing to form a dielectric layer 102 over front end of the line (FEOL) structures. FEOL structures can include, e.g., transistors formed in a substrate (with diffusion regions), contacts, metal lines, dielectric layers, etc. While the present embodiments can be employed to form devices at the FEOL, the present example will show and describe the formation of a vertical thin film transistor (TFT) at or close to the back end of the line (BEOL) in a fabrication cycle for the device 100. The dielectric layer 102 can include an interlevel dielectric (ILD) layer.

The device includes metal structures 104, 106, 108, 110 and 112 formed in a dielectric layer 102. The dielectric layer 102 can include dielectric materials, such as, e.g., low-k dielectrics, oxides, nitrides, and oxynitrides of silicon or other suitable dielectric materials. The metal structures 104, 106, 108, 110 and 112 can include any suitable conductive material, such as doped polycrystalline, metal (e.g., tungsten, titanium, tantalum, ruthenium, zirconium, cobalt, copper, aluminum, lead, platinum, tin, silver, gold, etc.), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials in one or more layers.

The metal structures 104, 106, 108, 110 and 112 can include contacts, metal lines or other electrically conductive components. The metal structures 104, 106, 108, 110 and 112 can be arranged in any suitable configuration. A planarization process or the like may be employed to planarize a top surface of the device 100 and expose structures 106 and 112. The planarization process can include an etch process or a chemical mechanical polish (CMP).

Figure 3:
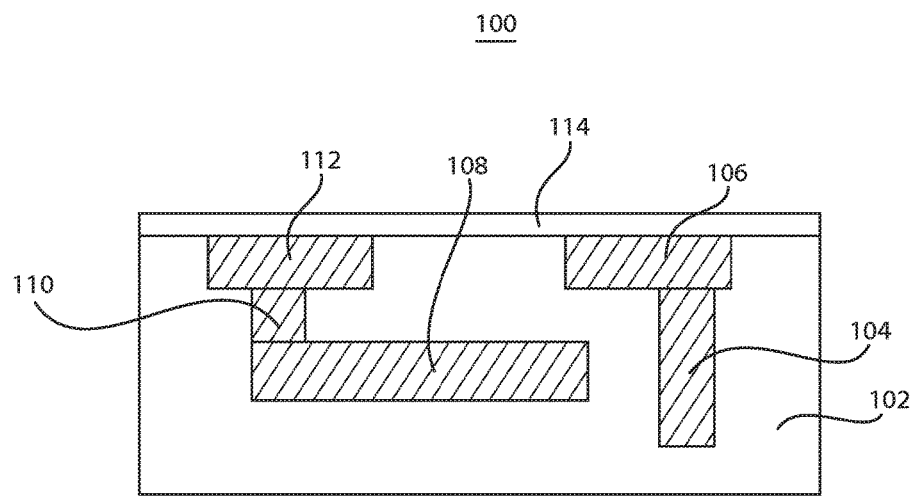
FIG. 3 is a cross-sectional view of the region of FIG. 2 showing a dielectric barrier deposited in accordance with an embodiment of the present invention.

Referring to FIG. 3, a dielectric barrier 114 is formed over the surface of the device 100. The dielectric barrier 114 can include a nitride, an N-block or other suitable dielectric material. In one embodiment, the dielectric barrier includes a thickness of between about 10 nm to about 20 nm, although other thicknesses may be employed. The dielectric barrier 114 can be formed by chemical vapor deposition (CVD), physical vapor deposition (PVD) or any other suitable deposition process.

Figure 4:
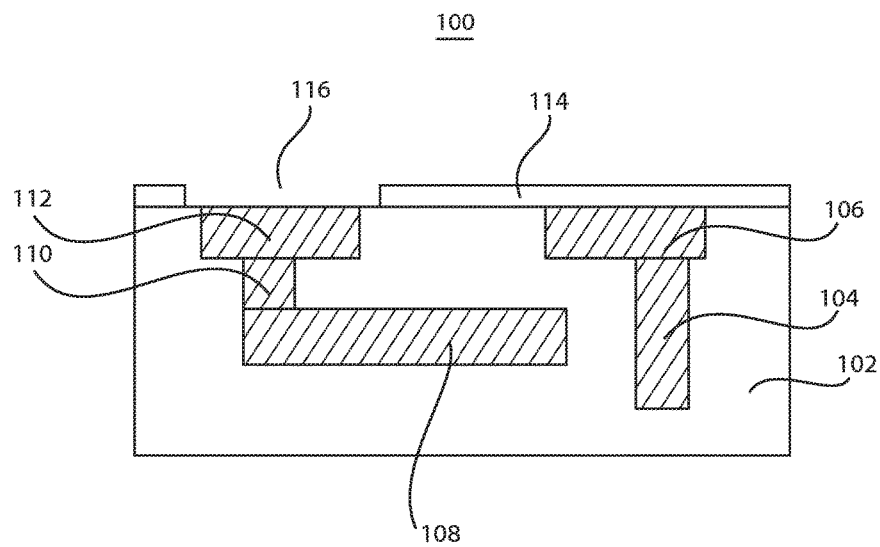
FIG. 4 is a cross-sectional view of the region of FIG. 3 showing the dielectric barrier opened up over a metal region in accordance with an embodiment of the present invention.

Referring to FIG. 4, the dielectric barrier 114 is patterned to form an opening 116 over the metal structure 112. The patterning process can include photolithography or any other suitable patterning process. The patterning process leaves the metal structure 112 exposed so that a conductive material formed in a next step can make electrical contact with metal structure 112.

Figure 5:
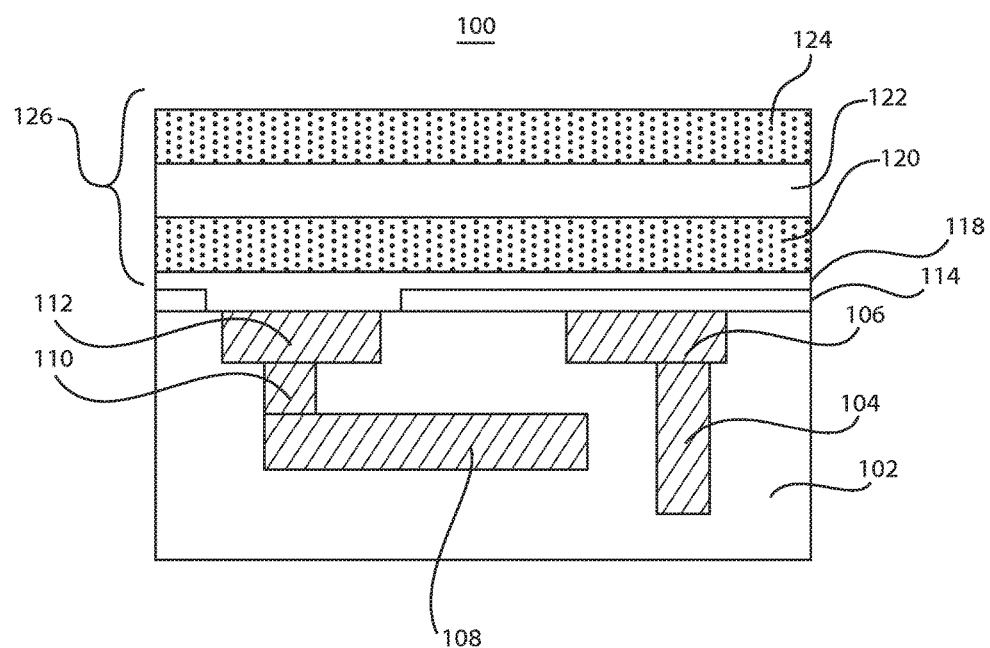
FIG. 5 is a cross-sectional view of the region of FIG. 4 showing a metal barrier layer formed on the dielectric barrier and in the opening of the dielectric barrier and the formation of a stack of layers for forming a source, drain and channel layer for the TFT device to be formed in accordance with an embodiment of the present invention.

Referring to FIG. 5, a stack 126 of layers are formed on the device 100. The stack 126 of layers includes the formation of source, channel and drain regions for a vertical TFT device. A barrier metal layer 118 is deposited to fill the opening 116, make contact with the metal structure 112 and cover the dielectric layer 114. The barrier metal layer 118 can include a metal compound to function as a diffusion barrier, such as a conducting metallic compound material or metal (e.g., tantalum nitride, titanium nitride, tantalum, tungsten nitride, TaSiN, combinations of these and other materials). The barrier metal layer 118 can be deposited using a chemical vapor deposition process (CVD), physical vapor deposition (PVD) or other suitable deposition process.

The stack 126 further includes layers 120, 122 and 124. These layers can be formed together or separately. In one embodiment, the layers 120, 122 and 124 are formed from polysilicon. Following deposition of the polysilicon layer(s), the deposited polysilicon can be doped with an appropriate dopant, or alternatively, an in-situ doping deposition process is employed in forming the polysilicon layer. In another embodiment, the layers 120, 122 and 124 are formed separately and doped in-situ or after formation, as needed. The deposition of the layers 120, 122 and 124 can include a CVD process, PVD process (e.g., evaporation) or any other suitable process. Using polysilicon or amorphous silicon, permits ease of manufacture of the TFT to be formed. Although monocrystalline materials are contemplated for layers 120, 122, 124, these devices can be more easily formed at FEOL locations.

The doping amount and conductivity type of the layers 120, 122 and 124 of the stack 126 will depend on the type of device being formed. In one example, the device to be formed can include an NFET device, and the layer 120 can be doped with n dopants with an n+ concentration, the layer 122 can remain undoped, and the layer 124 can be doped with n dopants with an n+ concentration. In another example, the device to be formed can include a PFET device and the layer 120 can be doped with p dopants with a p+ concentration, the layer 122 can remain undoped and the layer 124 can be doped with p dopants with a p+ concentration.

While sources and drains can be juxtaposed, the embodiment described can include a source layer 120 and a drain layer 124. In the example shown, the layer 122 forms a channel layer 122 for a vertical TFT device to be formed. In one embodiment, the layers 120, 122 and 124 have equal thicknesses although different thicknesses can be employed. The thicknesses of layers 120, 122 and 124 can include 50 nm-200 nm to provide a vertical TFT structure. Metal structures 108, 110 and 112 provide a connection to the source layer 120 through the barrier metal layer 118 (if employed).

In accordance with aspects of the present invention, the size (e.g., thickness), shape and doping levels of the layers 120, 122 and 124 can be controlled to tune or otherwise provide resistance control of the transistor device to be formed. In this way, the higher resistance devices can be created that are particularly suitable for cognitive devices, e.g., with crossbar grid structures. In addition, the use of polycrystalline materials such as, e.g., polysilicon, adds resistance and therefore reduces current in the transistor to be formed.

Figure 6:
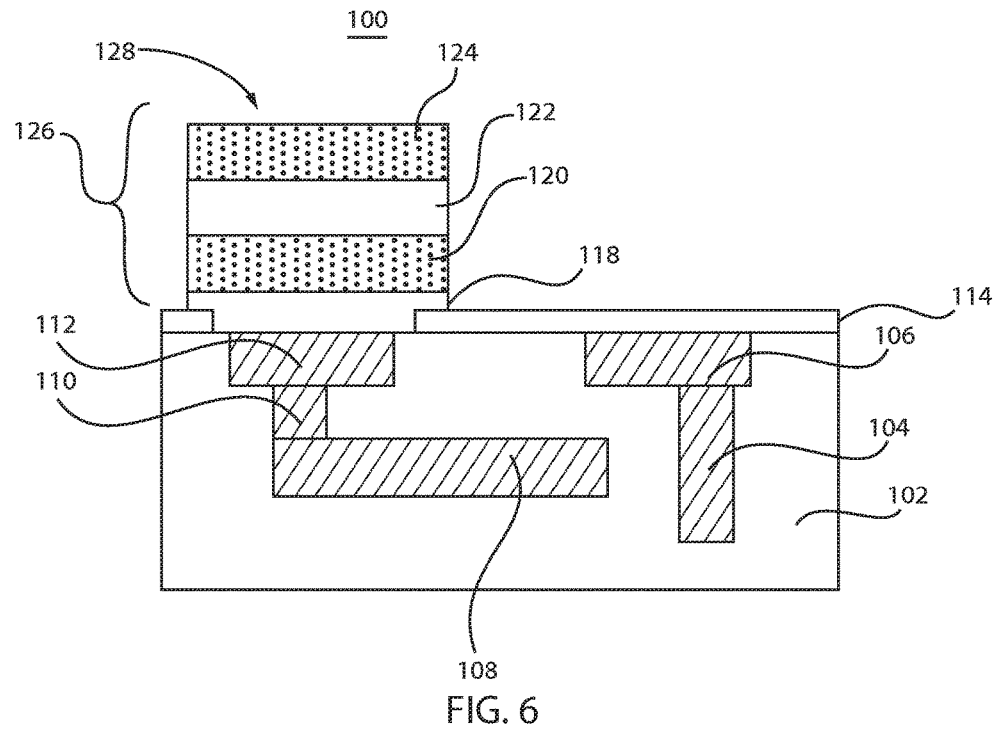
FIG. 6 is a cross-sectional view of the region of FIG. 5 showing metal barrier layer and the stack of layers for forming a source, drain and channel layer for the TFT device patterned to size and shape the TFT device in accordance with an embodiment of the present invention.

Referring to FIG. 6, a patterning process is performed to pattern and shape the stack 126 to form a transistor shape 128. The transistor shape 128 can include any useful shape when viewed from a top of the device 100 down toward layer 124. The shape can include a round shape, an oval shape, a polygonal shape (e.g., square, rectangle triangle, octagon, etc.). The patterning process can include a lithographical patterning process or any other patterning process.

In one example, a photoresist can be deposited over the stack and exposed to light to form a resist mask. Then, an anisotropic etch, such as, e.g., a reactive ion etch (RIE) process can be performed to etch the stack 126 down to the dielectric layer 114. A single etch process can be performed for all layers of the stack 126 or multiple etch processes can be employed depending on the materials and the structure.

Figure 7:
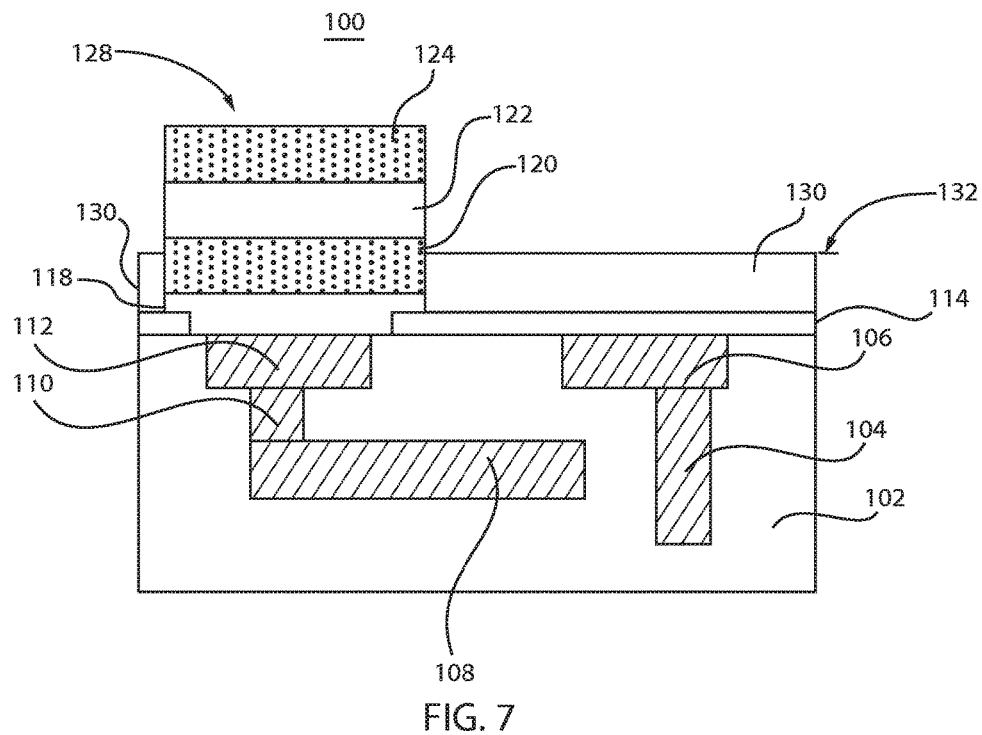
FIG. 7 is a cross-sectional view of the region of FIG. 6 showing a spacer layer formed on the dielectric barrier in accordance with an embodiment of the present invention.

Referring to FIG. 7, a spacer layer 130 is deposited over the device 100. The spacer layer 130 can include any dielectric material including, e.g., silicon oxide, silicon nitride, silicate glasses or any other suitable dielectric. The spacer layer 130 initially covers that layer 124. A planarization process, such as a CMP, can be employed to remove the dielectric material of the spacer layer 130 down to the layer 124. Then, a selective recess etch can be employed to recess the dielectric material to a height 132 relative to the shaped transistor 128. The recess etch can include a wet or dry etch process selective to the materials of the shaped transistor 128, e.g., layers 120, 122, 124. The height 132 defines a position for a gate conductor to be formed. The gate conductor should be relatively aligned with the channel layer 122 and will sit on top of the spacer layer 130.

Figure 8:
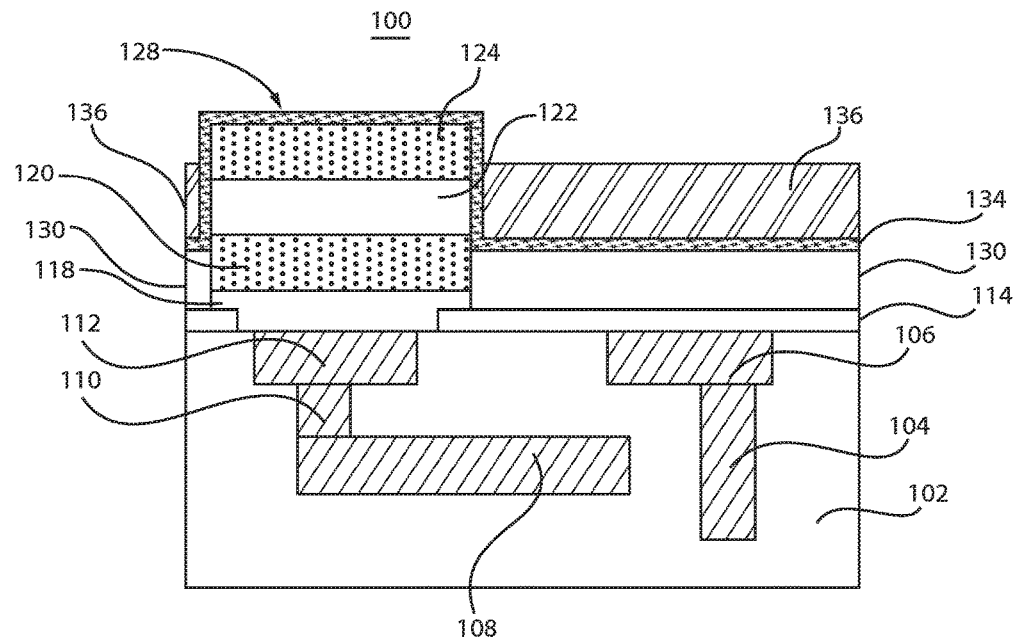
FIG. 8 is a cross-sectional view of the region of FIG. 7 showing a gate dielectric formed over the stack of layers and the spacer layer, and a gate metal formed on the gate dielectric in accordance with an embodiment of the present invention.

Referring to FIG. 8, a dielectric layer 134 is conformally formed over the device 100. The dielectric layer 134 forms a gate dielectric between the channel layer 122 and a gate conductor layer 136 formed over the dielectric layer 134. The dielectric layer 134 can be formed using CVD, PVD or other suitable deposition processes.

The dielectric layer 134 can include an oxide, a nitride or other suitable dielectric material. In one embodiment, the dielectric layer 134 includes a "high-k" dielectric material featuring a dielectric constant (k) higher than the dielectric constant of $SiO_2$. High-k dielectric materials can include, but are not limited to, hafnium oxides, hafnium silicates, titanium oxides, barium-strontium-titanates (BSTs) and lead-zirconate-titanates (PZTs).

The gate conductor layer 136 includes a conductive material including, but not limited to metals, metal alloys, metal nitrides and metal silicides, as well as laminates thereof and composites thereof. In one embodiment, the gate conductor layer 136 may be any metal including, but not limited to W, Ni, Ti, Mo, Ta, Cu, Pt, Ag, Au, Ru, Ir, Rh, and Re, and alloys that include at least one of the aforementioned conductive elemental metals. The gate conductor layer 136 may also include doped polysilicon and/or polysilicon-germanium alloy materials (i.e., having a dopant concentration from $1 \times 10^{18}$ dopant atoms per cubic centimeter to $1 \times 10^{22}$ dopant atoms per cubic centimeter) and polycide materials (doped polysilicon/metal silicide stack materials).

In useful embodiments, the gate conductor layer 136 includes a metal deposited using CVD, sputtering or other suitable deposition process. Examples of metals that may be employed for the at least one gate conductor layer may include, but are not limited to, W, Ti, Ta, Cu, Pt, Ag, Au, Al, TiN, WN, TaN, TiAlN, TaAlN, and alloys thereof.

The gate conductor layer 136 is positioned adjacently (e.g., coplanar) to the layer 122, which acts as a channel layer between source 120 and drain 124. The gate conductor layer 136 is deposited, planarized (e.g., CMP) and recessed (e.g., by a wet or dry etch) to control the thickness and the top height of the gate conductor layer 136. Further, the gate conductor layer 136 is located at the appropriate location of the stack 126 (e.g., centered on the channel layer although an offset can be provided) and surrounds the channel layer 122 partially or completely on all sides of the transistor shape 128.

Figure 9:
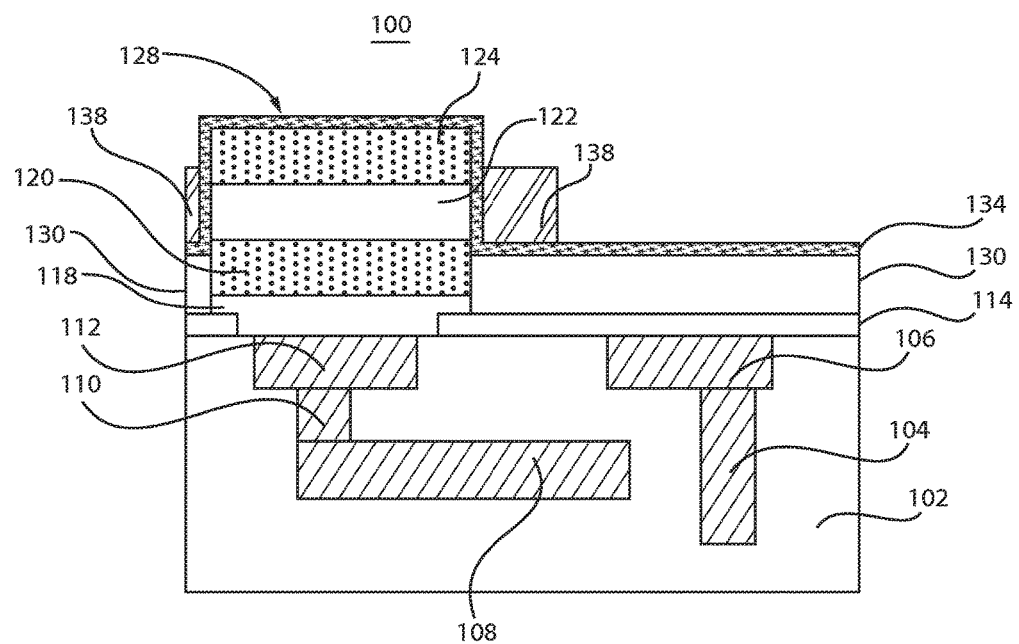
FIG. 9 is a cross-sectional view of the region of FIG. 8 showing the gate metal patterned to form a gate conductor that is associated with a position of the channel layer of the TFT device in accordance with an embodiment of the present invention.

Referring to FIG. 9, the gate conductor layer 136 is patterned to form a patterned gate conductor 138. The gate conductor 138 can be patterned to control the size and shape of the gate conductor 138. The gate conductor 138 can fully or partially surround the transistor shape 128. The patterning process can include a lithographical patterning process or any other patterning process.

In one example, a photoresist can be deposited over the gate conductor layer 136 and exposed to radiation (e.g., ultraviolet (UV) light) to form a resist mask. Then, an anisotropic etch, such as, e.g., a reactive ion etch (RIE) process can be performed to etch the gate conductor layer 136 down to the gate dielectric layer 134.

Figure 10:
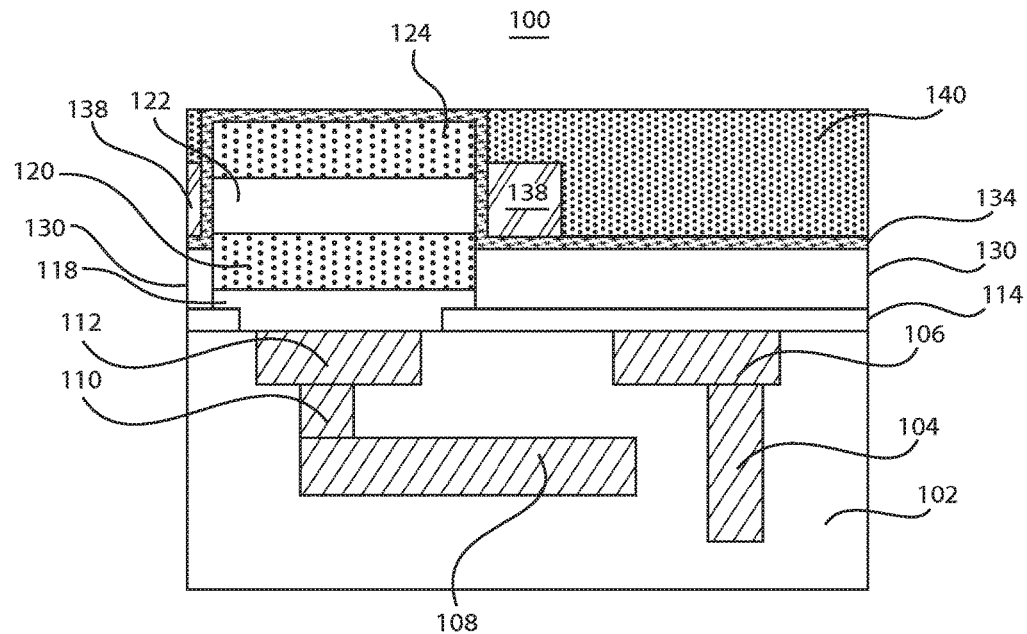
FIG. 10 is a cross-sectional view of the region of FIG. 9 showing a dielectric material formed on the gate conductor of the TFT device in accordance with an embodiment of the present invention.

Referring to FIG. 10, the gate conductor 138 needs to be electrically isolated. A dielectric cap layer 140 is deposited over the device 100, e.g., by CVD, a spin on process or other suitable process. The cap layer 140 can include an oxide, a nitride, or any other suitable dielectric material. In one embodiment, the cap layer is deposited and then subjected to a planarization process, e.g., a CMP process or etch to reduce the dielectric material to a level of the gate dielectric 134 on layer 124. In one embodiment, the dielectric cap layer 140 can be left having a thickness sufficient for forming other metal structures (e.g., also form an interlevel dielectric (ILD) layer). Alternately, a second dielectric layer (ILD 142, FIG. 11) can be formed to build up the thickness of the dielectric material for forming metal structures as will be described.

Figure 11:
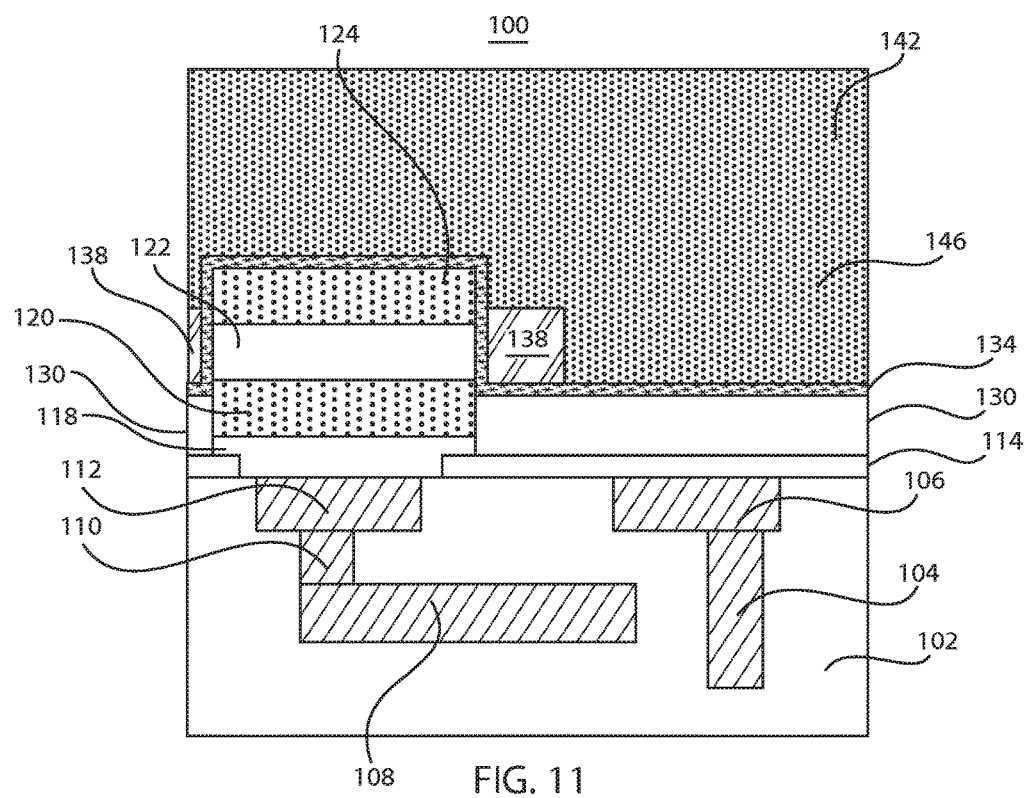
FIG. 11 is a cross-sectional view of the region of FIG. 10 showing an interlevel dielectric layer formed in accordance with an embodiment of the present invention.

Referring to FIG. 11, an interlevel dielectric layer (ILD) 142 is formed on the device 100. The ILD 142 can be formed concurrently with cap layer 140 or may be formed in a separate process. In one embodiment, the ILD 142 can include an oxide, a nitride, or any other suitable dielectric material. In one embodiment, the ILD 142 include a same material as the cap layer 140. In other embodiments, different materials can be used for the cap layer 140 and the ILD 142. The ILD 142 is deposited and then can be subjected to a planarization process, e.g., a CMP process or etch to reduce the dielectric material to a desired level.

Figure 12:
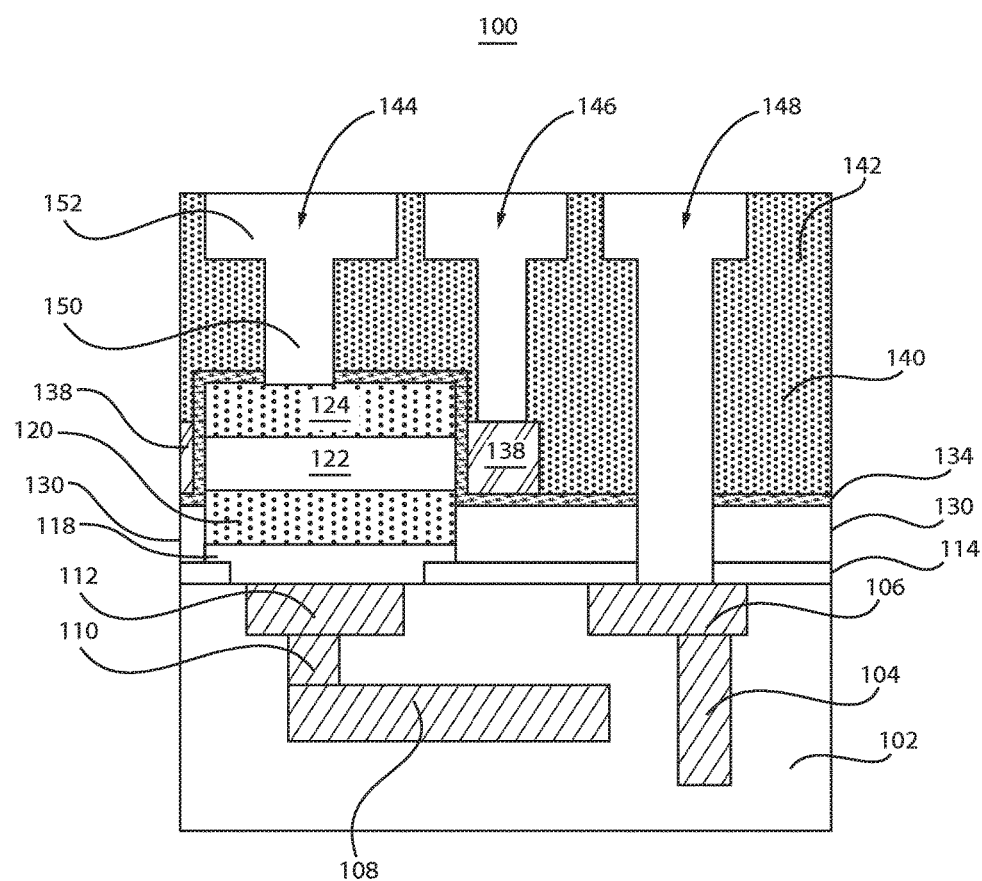
FIG. 12 is a cross-sectional view of the region of FIG. 11 showing the interlevel dielectric layer patterned to form openings for metal structures and contacts in accordance with an embodiment of the present invention.

Referring to FIG. 12, the ILD 142 is patterned to form openings 144, 146 and 148 therethrough. The openings 144, 146 and 148 can be formed by one or more lithographic patterning and etch sequences. One etch process can form contact holes 150 with respect to a resist mask (not shown) and another etch to form metal line trenches 152 with respect to another resist mask (not shown).

Opening 144 exposes the layer 124 to provide a connection path to the drain of the transistor. Opening 146 exposes the gate conductor 138 to provide a gate contact path. Opening 148 exposes the metal structure 106 to provide a connection path thereto for other connections.

Figure 13:
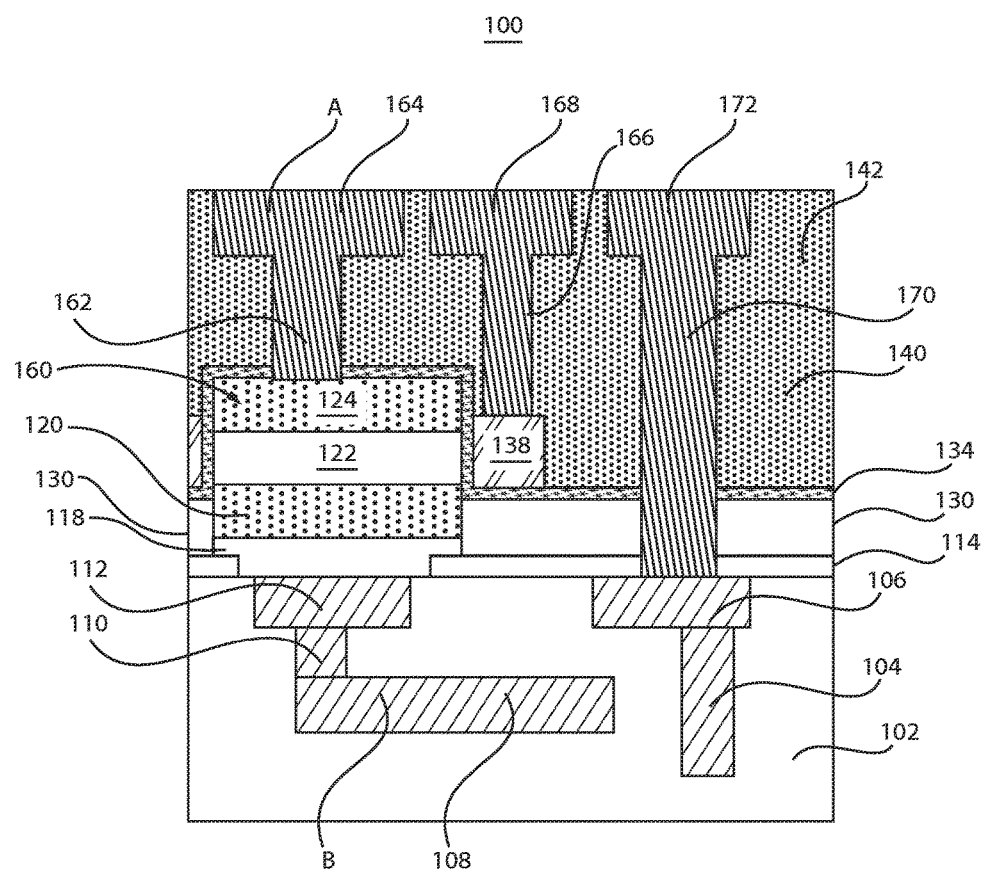
FIG. 13 is a cross-sectional view of the region of FIG. 12 showing contacts and metal lines formed in the interlevel dielectric layer in accordance with an embodiment of the present invention.

Referring to FIG. 13, a metal or conductive layer is deposited over the device 100 to fill openings 144, 146 and 148. A planarization process, such as CMP or an etch can be performed to remove the excess metal and form contacts 162, 166 and 170 and metal lines 164, 168 and 172.

The contacts 162, 166 and 170 and metal lines 164, 168 and 172 may include any suitable conductive material, such as polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition. The contacts 162, 166 and 170 and metal lines 164, 168 and 172 can be formed over a barrier material or liner (such as, TaN, TiN, etc. (not shown)).

A transistor 160 can be formed between metal lines 164 and 108 within upper layer of the device 100. The transistor 160 can include a transistor 20 (FIG. 1) connected in a crossbar grid or other metal structure configuration. In one example, the metal line 164 can include a metal line 14 (FIG. 1) and the metal line 108 can include a metal line 12 (FIG. 1). As depicted in FIG. 13, the metal line 164 connects to A of the transistor 160 and the metal line 108 connects to B of the transistor 160. Metal line 108 and metal line 164 can be transversely disposed in a crossbar arrangement.

It should be understood that the transistor 160 and the metal lines 108, 164 can be formed or arranged differently. For example, the metal lines 108 and 164 can be formed in a grid below the transistor 160 or above the transistor 160. The transistor 160 could also be formed in a same plane as one or more the metal lines 108, 164. The metal lines and structures can be configured to connect with the source and drain sides of the transistor 160, as needed, using contacts and metal lines.

It should be further understood that the transistor 160 is vertically disposed and includes horizontally stacked layers 120, 122, 124. The horizontally stacked layers 120, 122, 124 include a channel layer 122 that is enabled using a gate electrode (138) that surrounds or at least partially surrounds the channel layer 122. In the illustrative embodiment shown, the transistor 160 is formed within the BEOL portion of the device 100. However, transistors can be present at any or different levels within the device.

Figure 14:
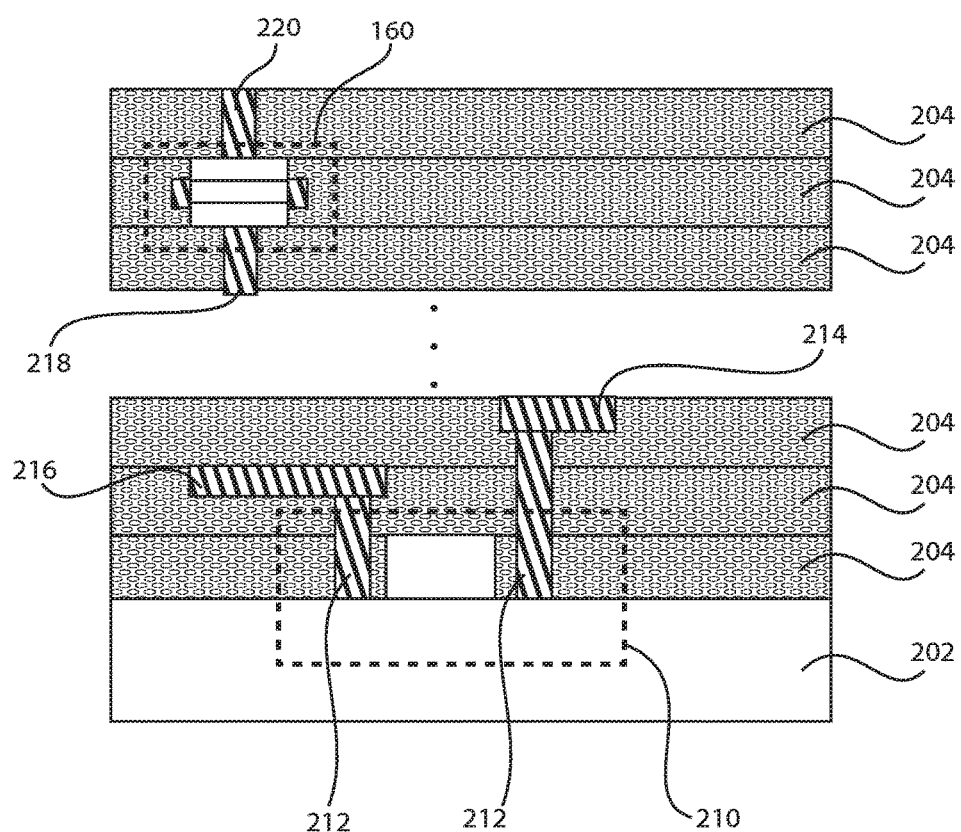
FIG. 14 is a cross-sectional view showing the BEOL TFT device formed in a BEOL region and a front end of the line (FEOL) device formed therebelow in accordance with an embodiment of the present invention.

Referring to FIG. 14, a schematic cross-sectional view of a cognitive device 200 shows a transistor 160 formed at the BEOL in accordance with embodiments of the present invention. The device 200 also shows a FEOL transistor 210. The FEOL transistor 210 can include a vertical transistor formed in a manner similar to that of transistor 160, but employing monocrystalline or polycrystalline source, drain and channel layer materials.

In the embodiment shown, transistor 210 can include a planar transistor, a thin film transistor, a vertical transistor, a vertical TFT or any other suitable transistor type. The transistor 210 can be formed at or near a substrate 202 and be connected to other devices using contacts 212 and/or metal lines 216, 214 formed in one or more ILDs 204. The transistor 160 is formed as described at the BEOL and connects to metal lines (e.g., in a crossbar grid (not shown) using contacts 218 and 220.

Processing can continue with the formation of additional BEOL structures including but not limited to ILDs, contacts, metal lines, metal-insulator-metal (MIM) capacitors, etc.

Figure 15:
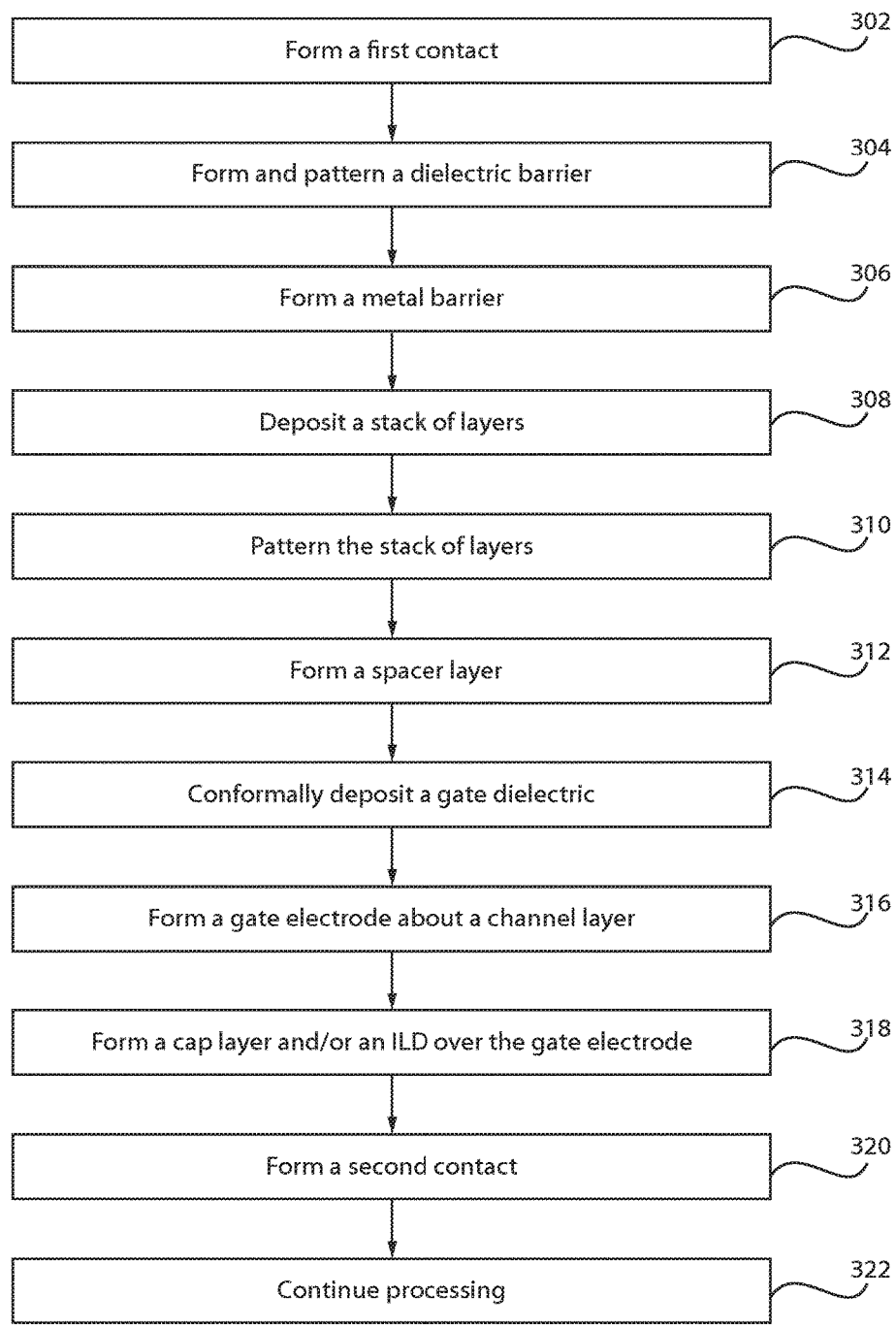
FIG. 15 is a block/flow diagram showing methods for forming a low mobility, low current, high resistance vertical TFT in accordance with embodiments of the present invention.

Referring to FIG. 15, methods for forming semiconductor devices are illustratively shown and described. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 302, a first contact is formed through an interlevel dielectric layer (ILD) (e.g., a prior or first ILD). This ILD can be in a FEOL region, between FEOL structures and BEOL structures or in the BEOL region. The first contact can be connected to FEOL structures or any other suitable structures, e.g., lines of crossbar grid disposed in a first direction. In block 304, in one embodiment, a dielectric barrier can be formed and patterned to form openings down to the first contact. In block 306, a metal barrier can be formed on the dielectric barrier and in the opening(s) in the dielectric barrier.

In block 308, a stack of layers is formed on the ILD layer (on the dielectric barrier or the metal barrier, if present) and over the first contact. The stack of layers includes a source layer, a drain layer and a channel layer disposed between the source layer and the drain layer. The source and drain layers can be similarly doped to form an NFET or PFET. In one embodiment, the channel layer is undoped. The stack of layers are sized and dimensioned to form a vertical TFT. The materials employed, the doping levels and the shapes of the device can all be employed to tune the mobility, the resistance and the current through the device. This control and the ability to employ a low mobility high resistance structure is useful in cognitive device applications. The stack of layers can be deposited using a same base material for each layer of the stack wherein the source layer and the drain layer include a same doping conductivity and the channel layer is undoped. In other embodiments, different materials can be employed for different layers. In one embodiment, a polycrystalline material is employed for the stack of layers and a same base material, such as, e.g., polysilicon is employed for the source, drain and channel layers.

In block 310, the stack layers, which may or may not include the metal barrier layer, are patterned to form a shape of the transistor to be formed. Lithographic or other patterning techniques can be employed.

In block 312, a spacer layer is formed over the first ILD layer (or dielectric barrier, if present) to provide a platform for a gate metal to be formed to position the gate metal even with the channel layer.

In block 314, a gate dielectric is conformally deposited over the spacer layer and the stack of layers. In block 316, a gate electrode is formed in a common plane with the channel layer over the gate dielectric on the spacer layer. This can include a deposition process and a patterning process. The gate electrode can surround or partially surround the channel layer with the gate dielectric disposed between gate electrode and the channel layer. The gate electrode at least partially surrounds the channel layer at a periphery of the channel layer.

In block 318, a dielectric cap layer and/or a second ILD are formed over the gate electrode and the stack of layers. In block 320, a second contact is formed on an opposite side (vertical offset) from the first contact. The first contact and the second contact connect to the vertical TFT formed by the stack of layers. In block 322, processing can continue to complete the device. The vertical TFT may be formed on dielectric layers at a back end of the line region of the semiconductor device. The vertical TFT can have its source layer connected to a first metal line with the first contact, and the drain layer can be connected to a second metal line (which is transversely disposed to the first metal line) in a crossbar grid structure using the second contact.

Having described preferred embodiments for semiconductor devices and methods for forming semiconductor devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
a stack of layers stacked vertically and including a source layer, a drain layer and a channel layer between the source layer and the drain layer, the drain layer formed from a polycrystalline material;
a gate electrode formed in a common plane with the channel layer;
a gate dielectric formed vertically between the gate electrode and the channel layer;
a first contact contacting the stack of layers on a first side of the stack of layers;
a second contact formed on an opposite side vertically from the first contact; and
a barrier metal layer interfacing between the polycrystalline material of the drain layer and the second contact, the barrier metal layer extending through a portion of a dielectric barrier layer, and covering another portion of the dielectric barrier layer deposited at an interface between front end of the line structures and the semiconductor device.

2. The semiconductor device as recited in claim 1, wherein the stack of layers includes a same base material.

3. The semiconductor device as recited in claim 1, wherein the source layer and the drain layer include a same doping conductivity and the channel layer is undoped.

4. The semiconductor device as recited in claim 1, wherein the gate electrode completely surrounds the channel layer at a periphery of the channel layer.

5. The semiconductor device as recited in claim 1, wherein the gate electrode partially surrounds the channel layer at a periphery of the channel layer.

6. The semiconductor device as recited in claim 1, wherein the semiconductor device is formed on dielectric layers at a back end of the line region of the semiconductor device.

7. The semiconductor device as recited in claim 1, wherein the source layer connects to a first metal line and the drain layer connects to a second metal line transversely disposed to the first metal line in a crossbar grid structure.

8. The semiconductor device as recited in claim 1, wherein the source layer, the drain layer and the channel layer include a polycrystalline material selected to increase device resistance and reduce device current.

9. The semiconductor device as recited in claim 8, wherein the polycrystalline material includes polysilicon.

10. The semiconductor device as recited in claim 1, wherein the source layer, the drain layer and the channel layer each include a same thickness.

11. The semiconductor device as recited in claim 10, wherein the same thickness is between about 50 nm to about 200 nm.

12. A semiconductor device, comprising:
a substrate having front end of the line (FEOL) devices formed thereon;
a cross bar grid including first lines and second lines formed transversely to the first lines;
back end of the line (BEOL) vertical transistors formed over an interlevel dielectric layer, the vertical transistors each including:
a stack of layers stacked vertically and including a source layer, a drain layer and a channel layer between the source layer and the drain layer, the drain layer formed from a polycrystalline material;
a gate electrode folioed in a common plane with the channel layer;
a gate dielectric formed vertically between the gate electrode and the channel layer;
a first contact connecting the source layer to a first line of the first lines; and
a second contact formed on an opposite side vertically from the first contact and connecting the drain layer to a second line of the second lines; and
a barrier metal layer interfacing between the polycrystalline material of the drain layer and the second contact, the barrier metal layer extending through a portion of a dielectric barrier layer, and covering another portion of the dielectric barrier layer deposited at an interface between the FEOL devices and the BEOL.

13. The semiconductor device as recited in claim 12, wherein the stack of layers includes a same base material.

14. The semiconductor device as recited in claim 12, wherein the source layer and the drain layer include a same doping conductivity and the channel layer is undoped.

15. The semiconductor device as recited in claim 12, wherein the gate electrode completely surrounds the channel layer at a periphery of the channel layer.

16. The semiconductor device as recited in claim 12, wherein the gate electrode partially surrounds the channel layer at a periphery of the channel layer.

17. The semiconductor device as recited in claim 12, wherein the source layer, the drain layer and the channel layer include a polycrystalline material selected to increase device resistance and reduce device current.

18. The semiconductor device as recited in claim 17, wherein the polycrystalline material includes polysilicon.

19. The semiconductor device as recited in claim 12, wherein the source layer, the drain layer and the channel layer each include a same thickness.

20. The semiconductor device as recited in claim 19, wherein the same thickness is between about 50 nm to about 200 nm.

* * * * *